United States Patent
Wang et al.

(10) Patent No.: US 8,520,453 B2
(45) Date of Patent: Aug. 27, 2013

(54) DEVICE FOR GENERATING A TEST PATTERN OF A MEMORY CHIP AND METHOD THEREOF

(75) Inventors: Shih-Hsing Wang, Hsinchu (TW); Chun-Ching Hsia, Hualien County (TW); Che-Chun Ou Yang, Taoyuan County (TW)

(73) Assignee: Etron Technology, Inc., Hsinchu (TW)

( * ) Notice: Subject to any disclaimer, the term of this patent is extended or adjusted under 35 U.S.C. 154(b) by 152 days.

(21) Appl. No.: 13/325,061

(22) Filed: Dec. 14, 2011

(65) Prior Publication Data

US 2012/0170387 A1      Jul. 5, 2012

(30) Foreign Application Priority Data

Jan. 3, 2011 (TW) .............................. 100100046 A

(51) Int. Cl.
*G11C 7/00* (2006.01)

(52) U.S. Cl.
USPC ..................................... 365/189.08; 365/201

(58) Field of Classification Search
USPC ............. 365/189.08, 201; 714/724; 324/765
See application file for complete search history.

(56) References Cited

U.S. PATENT DOCUMENTS

| | | | |
|---|---|---|---|
| 7,058,865 B2* | 6/2006 | Mori et al. | 714/724 |
| 7,317,324 B2* | 1/2008 | Watanabe et al. | 324/762.02 |
| 7,330,045 B2* | 2/2008 | Oshima | 324/762.01 |
| 7,363,558 B2* | 4/2008 | Fukuyama | 714/724 |

\* cited by examiner

*Primary Examiner* — Son Dinh
(74) *Attorney, Agent, or Firm* — Winston Hsu; Scott Margo

(57) ABSTRACT

A method of generating a test pattern of a memory chip includes generating and outputting a pattern enabling signal according to a first pattern signal and a second pattern signal, generating and outputting a first pre-input-output signal and a second pre-input-output signal according to a memory bank signal, a section signal, and the pattern enabling signal, executing an exclusive-OR logic operation on a third input-output signal and the second pattern signal to generate and output a first enabling signal, generating and outputting a first input-output signal and a second input-output signal according to the first enabling signal, the first pre-input-output signal and the second pre-input-output signal, and writing a predetermined logic voltage to each memory cell of the memory chip according to the first input-output signal and the second input-output signal.

15 Claims, 8 Drawing Sheets

|  | bank0, bank2 | | | |
|---|---|---|---|---|
|  | SEC1 | | SEC2 | |
|  | BL0~3 | BL4~7 | BL0~3 | BL4~7 |

All 0's:

| BL0~3 | BL4~7 | BL0~3 | BL4~7 |
|---|---|---|---|
| 1 | 0 | 0 | 1 |
| 1 | 0 | 0 | 1 |
| 1 | 0 | 0 | 1 |
| 1 | 0 | 0 | 1 |

All 1's:

| BL0~3 | BL4~7 | BL0~3 | BL4~7 |
|---|---|---|---|
| 0 | 1 | 1 | 0 |
| 0 | 1 | 1 | 0 |
| 0 | 1 | 1 | 0 |
| 0 | 1 | 1 | 0 |

Checkerboard pattern:

| BL0~3 | BL4~7 | BL0~3 | BL4~7 |
|---|---|---|---|
| 0 | 0 | 1 | 1 |
| 1 | 1 | 0 | 0 |
| 0 | 0 | 1 | 1 |
| 1 | 1 | 0 | 0 |

Row bar pattern:

| BL0~3 | BL4~7 | BL0~3 | BL4~7 |
|---|---|---|---|
| 1 | 1 | 0 | 0 |
| 1 | 1 | 0 | 0 |
| 1 | 1 | 0 | 0 |
| 1 | 1 | 0 | 0 |

Column bar pattern:

| BL0~3 | BL4~7 | BL0~3 | BL4~7 |
|---|---|---|---|
| 0 | 1 | 1 | 0 |
| 1 | 0 | 0 | 1 |
| 0 | 1 | 1 | 0 |
| 1 | 0 | 0 | 1 |

FIG. 2B

FIG. 3B bank1, bank3

All 0's

| | BL3 BL2 BL1 BL0 | | SEC1 | | SEC2 | |
|---|---|---|---|---|---|---|
| | (array WL0–WL3) | | BL0~3 | BL4~7 | BL0~3 | BL4~7 |
| | | WL0 | 0 | 1 | 1 | 0 |
| | | WL1 | 0 | 1 | 1 | 0 |
| | | WL2 | 0 | 1 | 1 | 0 |
| | BL7 BL6 BL5 BL4 | WL3 | 0 | 1 | 1 | 0 |

All 1's

| | | | BL0~3 | BL4~7 | BL0~3 | BL4~7 |
|---|---|---|---|---|---|---|
| | | WL0 | 1 | 0 | 0 | 1 |
| | | WL1 | 1 | 0 | 0 | 1 |
| | | WL2 | 1 | 0 | 0 | 1 |
| | | WL3 | 1 | 0 | 0 | 1 |

Checkerboard pattern

| | | | BL0~3 | BL4~7 | BL0~3 | BL4~7 |
|---|---|---|---|---|---|---|
| | | WL0 | 1 | 1 | 0 | 0 |
| | | WL1 | 0 | 0 | 1 | 1 |
| | | WL2 | 1 | 1 | 0 | 0 |
| | | WL3 | 0 | 0 | 1 | 1 |

Row bar pattern

| | | | BL0~3 | BL4~7 | BL0~3 | BL4~7 |
|---|---|---|---|---|---|---|
| | | WL0 | 0 | 0 | 1 | 1 |
| | | WL1 | 0 | 0 | 1 | 1 |
| | | WL2 | 0 | 0 | 1 | 1 |
| | | WL3 | 0 | 0 | 1 | 1 |

Column bar pattern

| | | | BL0~3 | BL4~7 | BL0~3 | BL4~7 |
|---|---|---|---|---|---|---|
| | | WL0 | 1 | 0 | 0 | 1 |
| | | WL1 | 0 | 1 | 1 | 0 |
| | | WL2 | 1 | 0 | 0 | 1 |
| | | WL3 | 0 | 1 | 1 | 0 |

FIG. 3B

| BA | S | IO_0123 | IO_4567 |
|----|---|---------|---------|
| 0  | 0 | 0       | 1       |
| 0  | 1 | 1       | 0       |
| 1  | 0 | 1       | 0       |
| 1  | 1 | 0       | 1       |
| 0  | 0 | 0       | 1       |
| 0  | 1 | 1       | 0       |
| 1  | 0 | 1       | 0       |
| 1  | 1 | 0       | 1       |

FIG. 4A

| Pattern | TM1 | TM2 | emarymp | IO |
|---|---|---|---|---|
| Solid pattern All 0's | 0 | 0 | 1 | 0000 |
| Solid pattern All 1's | 0 | 0 | 1 | 1111 |
| Checkerboard pattern | 0 | 1 | 0 | 0101 |
| Column bar pattern | 1 | 0 | 0 | 0000 |
| Row bar pattern | 1 | 1 | 1 | 0101 |

FIG. 4B

DEVICE FOR GENERATING A TEST PATTERN OF A MEMORY CHIP AND METHOD THEREOF

BACKGROUND OF THE INVENTION

1. Field of the Invention

The present invention is related to a device for generating a test pattern of a memory chip and method thereof, and particularly to a device that utilizes simple logic circuits to simplify generation of a test pattern of a memory chip and method thereof.

2. Description of the Prior Art

In the newest generation structures (open-bit line structures $6F^2$, $8F^2$) of dynamic random access memory, because memory cells of the open-bit line structures $6F^2$, $8F^2$ are smaller, arrangement of the memory cells is more compact and each cell may receive more noise from adjacent memory cells.

Because unit area of the DRAM with open-bit line structures $6F^2$, $8F^2$ has more memory cells, it is difficult to write a correct test pattern to the DRAM with open-bit line structures $6F^2$, $8F^2$, such that reduction of test bit cost of the memory chip becomes a significant issue for a designer. In the prior art, no simple test method can write a solid pattern, a checkerboard pattern, a row bar pattern, and a column bar pattern to the memory chip. Therefore, it is difficult to reduce the test bit cost of the memory chip by utilizing the test method of the prior art.

SUMMARY OF THE INVENTION

An embodiment provides a device for generating a test pattern of a memory chip. The device includes a first logic circuit, a second logic circuit, a first exclusive-OR gate, and a third logic circuit. The first logic circuit has a first input terminal for receiving a first pattern signal, a second input terminal for receiving a second pattern signal, and an output terminal for outputting a pattern enabling signal where the first logic circuit is used for generating and outputting the pattern enabling signal according to the first pattern signal and the second pattern signal. The second logic circuit has a first input terminal for receiving a memory bank signal, a second input terminal for receiving a section signal, a third input terminal coupled to the output terminal of the first logic circuit for receiving the pattern enabling signal, a first output terminal for outputting a first pre-input-output signal, and a second output terminal for outputting a second pre-input-output signal, where the second logic circuit is used for generating the first pre-input-output signal and the second pre-input-output signal according to the memory bank signal and the section signal, and outputting the first pre-input-output signal and the second pre-input-output signal according to the pattern enabling signal. The first exclusive-OR gate has a first input terminal for receiving a third input-output signal, a second input terminal coupled to the second input terminal of the first logic circuit for receiving the second pattern signal, and an output terminal for outputting a first enabling signal, where the first exclusive-OR gate is used for executing an exclusive-OR logic operation on the third input-output signal and the second pattern signal to generate and output the first enabling signal. The third logic circuit has a first input terminal coupled to the output terminal of the first exclusive-OR gate for receiving the first enabling signal, a second input terminal coupled to the first output terminal of the second logic circuit for receiving the first pre-input-output signal, a third input terminal coupled to the second output terminal of the second logic circuit for receiving the second pre-input-output signal, a first output terminal for outputting a first input-output signal, and a second output terminal for outputting a second input-output signal, where the third logic circuit is used for generating and outputting the first input-output signal and the second input-output signal according to the first enabling signal, the first pre-input-output signal, and the second pre-input-output signal, where the first input-output signal and the second input-output signal are used for writing a predetermined logic voltage to each memory cell of the memory chip.

Another embodiment provides a method of generating a test pattern of a memory chip. The method includes a first logic circuit generating and outputting a pattern enabling signal according to a first pattern signal and a second pattern signal; a second logic circuit generating a first pre-input-output signal and a second pre-input-output signal according to a memory bank signal and a section signal, and outputting the first pre-input-output signal and the second pre-input-output signal according to the pattern enabling signal; a first exclusive-OR gate executing an exclusive-OR logic operation on a third input-output signal and the second pattern signal to generate and output a first enabling signal; a third logic circuit generating and outputting a first input-output signal and a second input-output signal according to the first enabling signal, the first pre-input-output signal, and the second pre-input-output signal; writing a predetermined logic voltage to each memory cell of the memory chip according to the first input-output signal and the second input-output signal.

The present invention provides a device for generating a test pattern of a memory chip and method thereof. The device and the method execute simple logic operations (such as an exclusive-NOR logic operation and an exclusive-OR logic operation) on a first pattern signal, a second pattern signal, a memory bank signal, a third input-output signal, and a section signal to generate a first input-output signal and a second input-output signal. Then, the device can write a solid pattern, a checkerboard pattern, a row bar pattern, and a column bar pattern to the memory chip according to the first input-output signal and the second input-output signal. Therefore, the present invention can provide a very convenient test method to write the solid pattern, the checkerboard pattern, the row bar pattern, and the column bar pattern to the memory chip.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2B is a diagram illustrating a predetermined logic voltage stored in each memory cell when the device writes a solid pattern, a checkerboard pattern, a row bar pattern, and a column bar pattern to the even memory banks of the memory chip.

FIG. 3B is a diagram illustrating a predetermined logic voltage stored in each memory cell when the device writes the solid pattern, the checkerboard pattern, the row bar pattern, and the column bar pattern to the odd memory banks of the memory chip.

FIG. 4A is a diagram illustrating relationships among the memory bank signal, the section signal, the first pre-input-output signal, and the second pre-input-output signal.

FIG. 4B is a diagram illustrating relationships among the first pattern signal, the second pattern signal, the third input-output signal, the pattern enabling signal and the specific patterns written to the memory chip.

DETAILED DESCRIPTION

Figure 1:
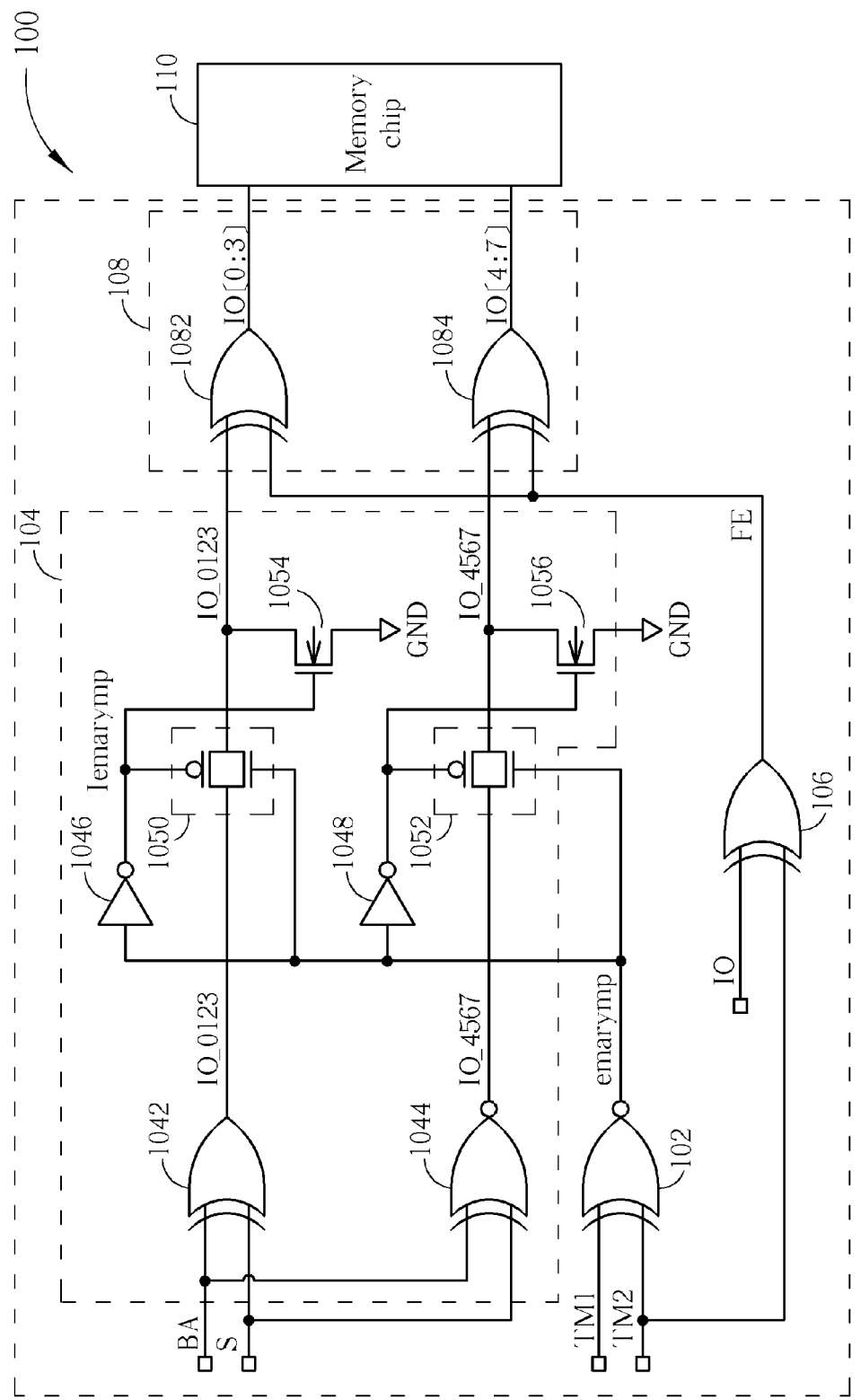
FIG. 1 is a diagram illustrating a device for generating a test pattern of a memory chip according to an embodiment.

Please refer to FIG. 1. FIG. 1 is a diagram illustrating a device 100 for generating a test pattern of a memory chip according to an embodiment. The device 100 includes a first logic circuit 102, a second logic circuit 104, a first exclusive-OR gate 106, and a third logic circuit 108. The first logic circuit 102 has a first input terminal for receiving a first pattern signal TM1, a second input terminal for receiving a second pattern signal TM2, and an output terminal for outputting a pattern enabling signal emarymp. The first logic circuit 102 is used for generating and outputting the pattern enabling signal emarymp according to the first pattern signal TM1 and the second pattern signal TM2, where the first logic circuit 102 is a first exclusive-NOR gate for executing an exclusive-NOR logic operation on the first pattern signal TM1 and the second pattern signal TM2 to generate the pattern enabling signal emarymp. The second logic circuit 104 has a first input terminal for receiving a memory bank signal BA, a second input terminal for receiving a section signal S, a third input terminal coupled to the output terminal of the first logic circuit 102 for receiving the pattern enabling signal emarymp, a first output terminal for outputting a first pre-input-output signal IO_0123, and a second output terminal for outputting a second pre-input-output signal IO_4567. The second logic circuit 104 is used for generating the first pre-input-output signal IO_0123 and the second pre-input-output signal IO_4567 according to the memory bank signal BA and the section signal S, and outputting the first pre-input-output signal IO_0123 and the second pre-input-output signal IO_4567 according to the pattern enabling signal emarymp. The first exclusive-OR gate 106 has a first input terminal for receiving a third input-output signal IO, a second input terminal coupled to the second input terminal of the first logic circuit 102 for receiving the second pattern signal TM2, and an output terminal for outputting a first enabling signal FE. The first exclusive-OR gate 106 is used for executing an exclusive-OR logic operation on the third input-output signal IO and the second pattern signal TM2 to generate and output the first enabling signal FE. The third logic circuit 108 has a first input terminal coupled to the output terminal of the first exclusive-OR gate 106 for receiving the first enabling signal FE, a second input terminal coupled to the first output terminal of the second logic circuit 104 for receiving the first pre-input-output signal IO_0123, a third input terminal coupled to the second output terminal of the second logic circuit 104 for receiving the second pre-input-output signal IO_4567, a first output terminal for outputting a first input-output signal IO [0:3], and a second output terminal for outputting a second input-output signal IO [4:7]. The third logic circuit 108 is used for generating and outputting the first input-output signal IO [0:3] and the second input-output signal IO [4:7] according to the first enabling signal FE, the first pre-input-output signal IO_0123, and the second pre-input-output signal IO_4567. The first input-output signal IO [0:3] and the second input-output signal IO [4:7] are used for writing a predetermined logic voltage to each memory cell of the memory chip 110, where the memory chip 110 is a dynamic random access memory (DRAM).

The second logic circuit 104 includes a second exclusive-OR gate 1042, a second exclusive-NOR gate 1044, a first inverter 1046, a second inverter 1048, a first transmission gate 1050, a second transmission gate 1052, a first switch 1054, and a second switch 1056. The second exclusive-OR gate 1042 has a first input terminal coupled to the first input terminal of the second logic circuit 104, a second input terminal coupled to the second input terminal of the second logic circuit 104, and an output terminal coupled to the first output terminal of the second logic circuit 104. The second exclusive-OR gate 1042 is used for executing an exclusive-OR logic operation on the memory bank signal BA and the section signal S to generate the first pre-input-output signal IO_0123. The second exclusive-NOR gate 1044 has a first input terminal coupled to the first input terminal of the second logic circuit 104, a second input terminal coupled to the second input terminal of the second logic circuit 104, and an output terminal coupled to the second output terminal of the second logic circuit 104. The second exclusive-NOR gate 1044 is used for executing an exclusive-NOR logic operation on the memory bank signal BA and the section signal S to generate the second pre-input-output signal IO_4567. The first inverter 1046 has a first terminal coupled to the output terminal of the first logic circuit 102, and a second terminal for outputting an inverse pattern enabling signal Iemarymp. The second inverter 1048 has a first terminal coupled to the output terminal of the first logic circuit 102, and a second terminal for outputting the inverse pattern enabling signal Iemarymp. The first transmission gate 1050 has a first terminal coupled to the second terminal of the first inverter 1046, a second terminal coupled to the output terminal of the second exclusive-OR gate 1042, a third terminal coupled to the output terminal of the first logic circuit 102, and a fourth terminal coupled to the first output terminal of the second logic circuit 104. The second transmission gate 1052 has a first terminal coupled to the second terminal of the second inverter 1048, a second terminal coupled to the output terminal of the second exclusive-NOR gate 1044, a third terminal coupled to the output terminal of the first logic circuit 102, and a fourth terminal coupled to the second output terminal of the second logic circuit 104. The first switch 1054 has a first terminal coupled to the first output terminal of the second logic circuit 104, a second terminal coupled to the second terminal of the first inverter 1046, and a third terminal coupled to ground GND. The second switch 1056 has a first terminal coupled to the second output terminal of the second logic circuit 104, a second terminal coupled to the second terminal of the second inverter 1048, and a third terminal coupled to the ground GND. The first switch 1054 and the second switch 1056 are N-type metal-oxide-semiconductors. When the pattern enabling signal emarymp is enabled (that is, the pattern enabling signal emarymp is at a logic-high voltage), the inverse pattern enabling signal Iemarymp is at a logic-low voltage. Therefore, the first transmission gate 1050 transmits the first pre-input-output signal IO_0123 to the first output terminal of the second logic circuit 104 according to the pattern enabling signal emarymp and the inverse pattern enabling signal Iemarymp, and the second transmission gate 1052 transmits the second pre-input-output signal IO_4567 to the second output terminal of the second logic circuit 104 according to the pattern enabling signal emarymp and the inverse pattern enabling signal Iemarymp. Meanwhile, because the inverse pattern enabling signal Iemarymp is at the logic-low voltage, the first switch 1054 and the second switch 1056 are turned off, and the second logic circuit 104 can output the first pre-input-output signal IO_0123 and the second pre-input-output signal IO_4567 to the third logic circuit 108. In addition, when the pattern enabling signal emarymp is disabled (that is, the pattern enabling signal emarymp is at the logic-low voltage), the inverse pattern enabling signal Iemarymp is at the logic-high voltage. Meanwhile, the first transmission gate 1050 and the second transmission gate 1052 are turned off, so the second logic circuit 104 can not output the first pre-input-output signal IO_0123 and the second pre-input-output signal IO_4567 to the third logic circuit 108.

The third logic circuit 108 includes a third exclusive-OR gate 1082 and a fourth exclusive-OR gate 1084. The third exclusive-OR gate 1082 has a first input terminal coupled to the second input terminal of the third logic circuit 108, a second input terminal coupled to the first input terminal of the third logic circuit 108, and an output terminal coupled to the first output terminal of the third logic circuit 108. The third exclusive-OR gate 1082 is used for executing an exclusive-OR logic operation on the first enabling signal FE and the first pre-input-output signal IO_0123 to generate the first input-output signal IO [0:3]. The fourth exclusive-OR gate 1084 has a first input terminal coupled to the third input terminal of the third logic circuit 108, a second input terminal coupled to the first input terminal of the third logic circuit 108, and an output terminal coupled to the second output terminal of the third logic circuit 108. The fourth exclusive-OR gate 1084 is used for executing an exclusive-OR logic operation on first enabling signal FE and the second pre-input-output signal IO_4567 to generate the second input-output signal IO [4:7].

Figure 2A:
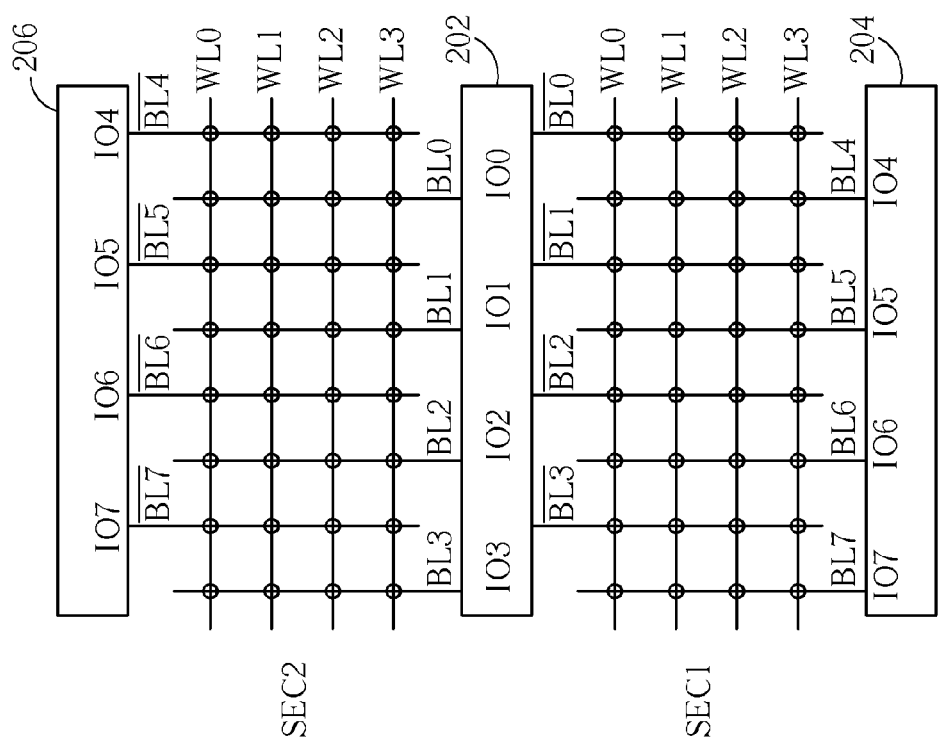
FIG. 2A is a diagram illustrating even memory banks of the memory chip.

Please refer to FIG. 2A and FIG. 2B. FIG. 2A is a diagram illustrating even memory banks bank0, bank2 of the memory chip 110, and FIG. 2B is a diagram illustrating a predetermined logic voltage stored in each memory cell when the device 100 writes a solid pattern, a checkerboard pattern, a row bar pattern, and a column bar pattern to the even memory banks of the memory chip 110. As shown in FIG. 2A, in an odd section SEC1 of the even memory banks bank0, bank2, output terminals IO0-IO3 of a sensing amplifier 202 are used for outputting inverse bit line signals $\overline{BL0}$-$\overline{BL3}$, and output terminals IO4-IO7 of a sensing amplifier 204 are used for outputting non-inverse bit line signals BL4-BL7. In addition, in even section SEC2 of the even memory banks bank0, bank2, the output terminals IO0-IO3 of the sensing amplifier 202 are used for outputting non-inverse bit line signals BL0-BL3, and output terminals IO4-IO7 of a sensing amplifier 206 are used for outputting inverse bit line signals $\overline{BL4}$-$\overline{BL7}$. But, the present invention is not limited to 4 word lines WL0-WL3. In addition, the present invention is also not limited to the two even memory banks bank0, bank2, the two sections SEC1, SEC2, and the 8 output terminals IO0-IO7. For example, in the odd section SEC1 with the checkerboard pattern of FIG. 2B, because the output terminals IO0-IO3 of the sensing amplifier 202 are used for outputting the inverse bit line signals $\overline{BL0}$-$\overline{BL3}$ and the output terminals IO4-IO7 of the sensing amplifier 204 are used for outputting the non-inverse bit line signals BL4-BL7, the output terminals IO0-IO3 of the sensing amplifier 202 and the output terminals IO4-IO7 of the sensing amplifier 204 output the same bit line signals 0101. Thus, the odd section SEC1 can display the checkerboard pattern. Similarly, in the even section SEC2 of the checkerboard pattern, because the output terminals IO0-IO3 of the sensing amplifier 202 are used for outputting the non-inverse bit line signals BL0-BL3 and the output terminals IO4-IO7 of the sensing amplifier 206 are used for outputting the inverse bit line signals $\overline{BL4}$-$\overline{BL7}$, the output terminals IO0-IO3 of the sensing amplifier 202 and the output terminals IO4-IO7 of the sensing amplifier 206 output the same bit line signals 1010. Thus, the even section SEC2 can display the checkerboard pattern. In addition, FIG. 2A only shows a repeat unit of the even memory banks bank0, bank2 of the memory chip 110, so the even memory banks bank0, bank2 of the memory chip 110 are composed of a plurality of repeat units. Further, other patterns in FIG. 2B are similar to the checkerboard pattern, so further description thereof is omitted.

Figure 3A:
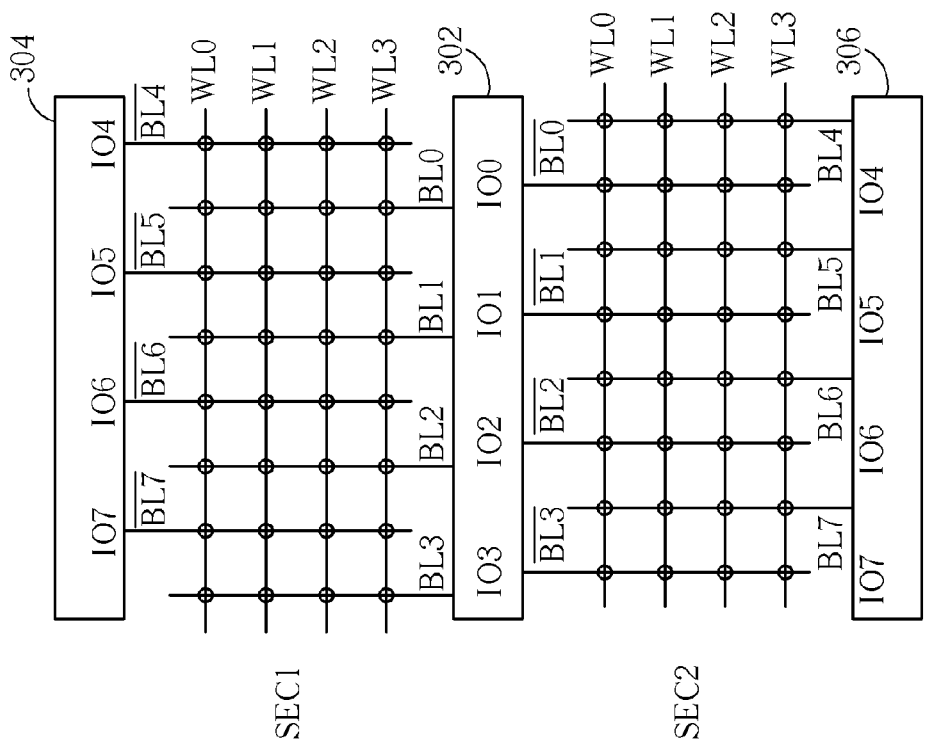
FIG. 3A is a diagram illustrating odd memory banks of the memory chip.

Please refer to FIG. 3A and FIG. 3B. FIG. 3A is a diagram illustrating odd memory banks bank1, bank3 of the memory chip 110, and FIG. 3B is a diagram illustrating a predetermined logic voltage stored in each memory cell when the device 100 writes the solid pattern, the checkerboard pattern, the row bar pattern, and the column bar pattern to the odd memory banks of the memory chip 110. As shown in FIG. 3A, in an odd section SEC1 of the odd memory banks bank1, bank3, output terminals IO0-IO3 of a sensing amplifier 302 are used for outputting non-inverse bit line signals BL0-BL3, and output terminals IO4-IO7 of a sensing amplifier 304 are used for outputting inverse bit line signals $\overline{BL4}$-$\overline{BL7}$. In addition, in an even section SEC2 of the odd memory banks bank1, bank3, the output terminals IO0-IO3 of the sensing amplifier 302 are used for outputting inverse bit line signals $\overline{BL0}$-$\overline{BL3}$, and output terminals IO4-IO7 of a sensing amplifier 306 are used for outputting non-inverse bit line signals BL4-BL7. But, the present invention is not limited to 4 word lines WL0-WL3. In addition, the present invention is also not limited to the two odd memory banks bank1, bank3, the two sections SEC1, SEC2, and the 8 output terminals IO0-IO7. For example, in the odd section SEC1 with the checkerboard pattern of FIG. 3B, because the output terminals IO0-IO3 of the sensing amplifier 302 are used for outputting the non-inverse bit line signals BL0-BL3 and the output terminals IO4-IO7 of the sensing amplifier 304 are used for outputting the inverse bit line signals $\overline{BL4}$-$\overline{BL7}$, the output terminals IO0-IO3 of the sensing amplifier 302 and the output terminals IO4-IO7 of the sensing amplifier 304 output the same bit line signals 1010. Thus, the odd section SEC1 can display the checkerboard pattern. Similarly, in the even section SEC2 of the checkerboard pattern, because the output terminals IO0-IO3 of the sensing amplifier 302 are used for outputting the inverse bit line signals $\overline{BL0}$-$\overline{BL3}$ and the output terminals IO4-IO7 of the sensing amplifier 306 are used for outputting the non-inverse bit line signals BL4-BL7, the output terminals IO0-IO3 of the sensing amplifier 302 and the output terminals IO4-IO7 of the sensing amplifier 306 also output the same bit line signals 0101. Thus, the even section SEC2 can display the checkerboard pattern. In addition, FIG. 3A only shows a repeat unit of the odd memory banks bank1, bank3 of the memory chip 110, so the odd memory banks bank1, bank3 of the memory chip 110 are composed of a plurality of repeat units. Further, other patterns in FIG. 3B are similar to the checkerboard pattern, so further description thereof is omitted.

Please refer to FIG. 4A and FIG. 4B. FIG. 4A is a diagram illustrating relationships among the memory bank signal BA, the section signal S, the first pre-input-output signal IO_0123, and the second pre-input-output signal IO_4567, and FIG. 4B is a diagram illustrating relationships among the first pattern signal TM1, the second pattern signal TM2, the third input-output signal IO, the pattern enabling signal emarymp and the specific patterns written to the memory chip 110. As shown in FIG. 4A, the memory bank signal BA "0" corresponds to the even memory banks bank0, bank2, the memory bank signal BA "1" corresponds to the odd memory banks bank1, bank3, the section signal S "0" corresponds to the even section SEC2, and the section signal S "1" corresponds to the odd section SEC1. For example, the memory bank signal BA "1" and the section signal S "0" correspond to the odd memory banks bank1, bank3 and the even section SEC2 of the memory chip 110. As shown in FIG. 4B, the first pattern signal TM1 "0", the second pattern signal TM2 "0", and the third input-output signal IO "0000" correspond to the solid pattern (all 0's); the first pattern signal TM1 "0", the second pattern signal TM2 "0", and the third input-output signal IO "1111" correspond to the solid pattern (all 1's); the first pattern signal TM1 "0", the second pattern signal TM2 "1", and the third input-output signal IO "0101" (WL0-WL3) correspond to the checkerboard pattern; the first pattern signal TM1 "1", the second pattern signal TM2 "0", and the third input-output signal IO "0000" correspond to the column bar pattern; and the first pattern signal TM1 "1", the second pattern signal TM2 "1", and the third input-output signal IO "0101" correspond to the row bar pattern. Therefore, when a first pattern signal TM1, a second pattern signal TM2, a memory bank signal BA, a third input-output signal IO, and a section signal S are inputted to the device 100, according to FIG. 4A and FIG. 4B, the device 100 can generate the first input-output signal IO [0:3] and the second input-output signal IO [4:7]. Then, the first input-output signal IO [0:3] and the second input-output signal IO [4:7] can write a predetermined logic voltage to each cell of the memory chip 110 through output terminals IO0-IO3 and output terminals IO4-IO7 of sensing amplifiers, respectively.

For example, a user intends to write the column bar pattern to the odd section SEC1 of the odd memory banks bank1, bank3 of the memory chip 110. Therefore, the user inputs the first pattern signal TM1 "1", the second pattern signal TM2 "0", the memory bank signal BA "1", the third input-output signal IO "0000", and the section signal S "1" to the device 100 according to FIG. 4A and FIG. 4B. Please refer to FIG. 1, because the first pattern signal TM1 is "1" and the second pattern signal TM2 is "0", the pattern enabling signal emarymp generated by the first logic circuit 102 is "0", resulting in the first transmission gate 1050 and the second transmission gate 1052 being turned off, and the first switch 1054 and the second switch 1056 being turned on. Because the first switch 1054 and the second switch 1056 are tuned on, the first pre-input-output signal IO_0123 and the second pre-input-output signal IO_4567 are pulled down to the ground GND ("0"). In addition, because the third input-output signal IO is "0000" and the second pattern signal TM2 is "0", the first enabling signal FE outputted by the first exclusive-OR gate 106 is "0000". Therefore, the first input-output signal IO [0:3] and the second input-output signal IO [4:7] outputted by the third logic circuit 108 are also "0000". Please refer to FIG. 3A and FIG. 3B. The output terminals IO0-IO3 of the sensing amplifier 302 input bit line signals "0000" to the bit lines WL0-WL3 according to the first input-output signal IO [0:3], and the output terminals IO4-IO7 of the sensing amplifier 304 input bit line signals "1111" inverse the bit line signals "0000" to the bit lines WL0-WL3 according to the second input-output signal IO [4:7]. Therefore, the odd section SEC1 of the odd memory banks bank1, bank3 of the memory chip 110 can display the column bar pattern through the above mentioned process. In addition, other patterns are similar to the column bar pattern, so further description thereof is omitted.

Figure 5:
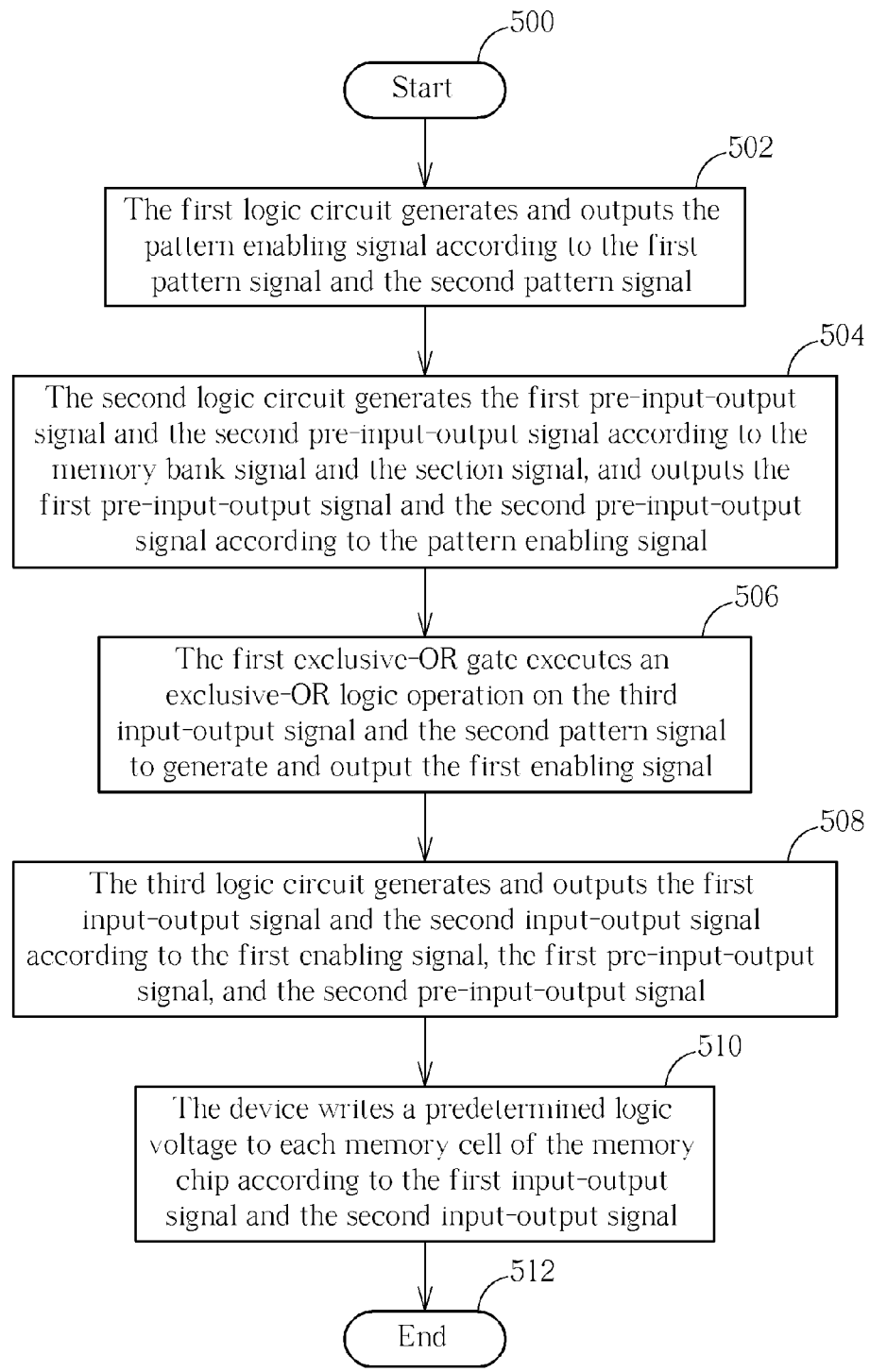
FIG. 5 is a flowchart illustrating a method of generating a test pattern of a memory chip according to another embodiment.

Please refer to FIG. 5. FIG. 5 is a flowchart illustrating a method of generating a test pattern of a memory chip according to another embodiment. The method in FIG. 5 uses the device 100 in FIG. 1 to illustrate the method. Detailed steps are as follows:

Step 500: Start.

Step 502: The first logic circuit 102 generates and outputs the pattern enabling signal emarymp according to the first pattern signal TM1 and the second pattern signal TM2.

Step 504: The second logic circuit 104 generates the first pre-input-output signal IO_0123 and the second pre-input-output signal IO_4567 according to the memory bank signal BA and the section signal S, and outputs the first pre-input-output signal IO_0123 and the second pre-input-output signal IO_4567 according to the pattern enabling signal emarymp.

Step 506: The first exclusive-OR gate 106 executes an exclusive-OR logic operation on the third input-output signal IO and the second pattern signal TM2 to generate and output the first enabling signal FE.

Step 508: The third logic circuit 108 generates and outputs the first input-output signal IO [0:3] and the second input-output signal IO [4:7] according to the first enabling signal FE, the first pre-input-output signal IO_0123, and the second pre-input-output signal IO_4567.

Step 510: The device 100 writes a predetermined logic voltage to each memory cell of the memory chip 110 according to the first input-output signal IO [0:3] and the second input-output signal IO [4:7].

Step 512: End.

In Step 502, the first logic circuit 102 utilizes the first exclusive-NOR gate to execute the exclusive-NOR logic operation on the first pattern signal TM1 and the second pattern signal TM2 to generate and output the pattern enabling signal emarymp. In Step 504, the second logic circuit 104 utilizes the second exclusive-OR gate 1042 to execute the exclusive-OR logic operation on the memory bank signal BA, and the section signal S to generate the first pre-input-output signal IO_0123, and utilizes the second exclusive-NOR gate 1044 to execute the exclusive-NOR logic operation on the memory bank signal BA and the section signal S to generate the second pre-input-output signal IO_4567. In addition, the second logic circuit 104 utilizes the first inverter 1046, the second inverter 1048, the first transmission gate 1050, the second transmission gate 1052, the first switch 1054, and the second switch 1056 to output the first pre-input-output signal IO_0123 and the second pre-input-output signal IO_4567 according to the pattern enabling signal emarymp. In Step 508, the third logic circuit 108 utilizes the third exclusive-OR gate 1082 to execute the exclusive-OR logic operation on the first enabling signal FE and the first pre-input-output signal IO_0123 to generate the first input-output signal IO [0:3], and utilizes the fourth exclusive-OR gate 1084 to execute the exclusive-OR logic operation on the first enabling signal FE and the second pre-input-output signal IO_4567 to generate the second input-output signal IO [4:7]. In Step 510, the device 100 writes the predetermined logic voltage to each memory cell of the memory chip 110 according to the first input-output signal IO [0:3] and the second input-output signal IO [4:7]. That is to say, the device 100 writes the solid pattern, the checkerboard pattern, the row bar pattern, and the column bar pattern to the memory chip 110 according to the first input-output signal IO [0:3] and the second input-output signal IO [4:7].

To sum up, the device for generating the test pattern of the memory chip and the method thereof execute simple logic operations (such as the exclusive-NOR logic operation and the exclusive-OR logic operation) on the first pattern signal, the second pattern signal, the memory bank signal, the third input-output signal, and the section signal to generate the first input-output signal and the second input-output signal. Then, the device for generating the test pattern of the memory chip can write the solid pattern, the checkerboard pattern, the row bar pattern, and the column bar pattern to the memory chip according to the first input-output signal and the second input-output signal. Therefore, the present invention can provide a very convenient test method to write the solid pattern, the checkerboard pattern, the row bar pattern, and the column bar pattern to the memory chip.

Those skilled in the art will readily observe that numerous modifications and alterations of the device and method may be made while retaining the teachings of the invention.

What is claimed is:

1. A device for generating a test pattern of a memory chip, the device comprising:
    a first logic circuit having a first input terminal for receiving a first pattern signal, a second input terminal for receiving a second pattern signal, and an output terminal for outputting a pattern enabling signal, wherein the first logic circuit is used for generating and outputting the pattern enabling signal according to the first pattern signal and the second pattern signal;
    a second logic circuit having a first input terminal for receiving a memory bank signal, a second input terminal for receiving a section signal, a third input terminal coupled to the output terminal of the first logic circuit for receiving the pattern enabling signal, a first output terminal for outputting a first pre-input-output signal, and a second output terminal for outputting a second pre-input-output signal, wherein the second logic circuit is used for generating the first pre-input-output signal and the second pre-input-output signal according to the memory bank signal and the section signal, and outputting the first pre-input-output signal and the second pre-input-output signal according to the pattern enabling signal;
    a first exclusive-OR gate having a first input terminal for receiving a third input-output signal, a second input terminal coupled to the second input terminal of the first logic circuit for receiving the second pattern signal, and an output terminal for outputting a first enabling signal, wherein the first exclusive-OR gate is used for executing an exclusive-OR logic operation on the third input-output signal and the second pattern signal to generate and output the first enabling signal; and
    a third logic circuit having a first input terminal coupled to the output terminal of the first exclusive-OR gate for receiving the first enabling signal, a second input terminal coupled to the first output terminal of the second logic circuit for receiving the first pre-input-output signal, a third input terminal coupled to the second output terminal of the second logic circuit for receiving the second pre-input-output signal, a first output terminal for outputting a first input-output signal, and a second output terminal for outputting a second input-output signal, wherein the third logic circuit is used for generating and outputting the first input-output signal and the second input-output signal according to the first enabling signal, the first pre-input-output signal, and the second pre-input-output signal;
    wherein the first input-output signal and the second input-output signal are used for writing a predetermined logic voltage to each memory cell of the memory chip.

2. The device of claim 1, wherein the first logic circuit is a first exclusive-NOR gate for executing an exclusive-NOR logic operation on the first pattern signal and the second pattern signal to generate the pattern enabling signal.

3. The device of claim 1, wherein the second logic circuit comprises:
    a second exclusive-OR gate having a first input terminal coupled to the first input terminal of the second logic circuit, a second input terminal coupled to the second input terminal of the second logic circuit, and an output terminal coupled to the first output terminal of the second logic circuit, wherein the second exclusive-OR gate is used for executing an exclusive-OR logic operation on the memory bank signal and the section signal to generate the first pre-input-output signal; and
    a second exclusive-NOR gate having a first input terminal coupled to the first input terminal of the second logic circuit, a second input terminal coupled to the second input terminal of the second logic circuit, and an output terminal coupled to the second output terminal of the second logic circuit, wherein the second exclusive-NOR gate is used for executing an exclusive-NOR logic operation on the memory bank signal and the section signal to generate the second pre-input-output signal.

4. The device of claim 3, wherein the second logic circuit further comprises:
    a first inverter having a first terminal coupled to the output terminal of the first logic circuit, and a second terminal for outputting an inverse pattern enabling signal;
    a second inverter having a first terminal coupled to the output terminal of the first logic circuit, and a second terminal for outputting the inverse pattern enabling signal;
    a first transmission gate having a first terminal coupled to the second terminal of the first inverter, a second terminal coupled to the output terminal of the second exclusive-OR gate, a third terminal coupled to the output terminal of the first logic circuit, and a fourth terminal coupled to the first output terminal of the second logic circuit, wherein the first transmission gate is used for transmitting the first pre-input-output signal according to the pattern enabling signal and the inverse pattern enabling signal;
    a second transmission gate having a first terminal coupled to the second terminal of the second inverter, a second terminal coupled to the output terminal of the second exclusive-NOR gate, a third terminal coupled to the output terminal of the first logic circuit, and a fourth terminal coupled to the second output terminal of the second logic circuit, wherein the second transmission gate is used for transmitting the second pre-input-output signal according to the pattern enabling signal and the inverse pattern enabling signal;
    a first switch having a first terminal coupled to the first output terminal of the second logic circuit, a second terminal coupled to the second terminal of the first inverter, and a third terminal coupled to ground; and
    a second switch having a first terminal coupled to the second output terminal of the second logic circuit, a second terminal coupled to the second terminal of the second inverter, and a third terminal coupled to the ground.

5. The device of claim 4, wherein the first switch and the second switch are N-type metal-oxide-semiconductors.

6. The device of claim 1, wherein the third logic circuit comprises:
    a third exclusive-OR gate having a first input terminal coupled to the second input terminal of the third logic circuit, a second input terminal coupled to the first input terminal of the third logic circuit, and an output terminal coupled to the first output terminal of the third logic circuit, wherein the third exclusive-OR gate is used for executing an exclusive-OR logic operation on the first enabling signal and the first pre-input-output signal to generate the first input-output signal; and a fourth exclusive-OR gate having a first input terminal coupled to the third input terminal of the third logic circuit, a second input terminal coupled to the first input terminal of the third logic circuit, and an output terminal coupled to the second output terminal of the third logic circuit, wherein the fourth exclusive-OR gate is used for executing an exclusive-OR logic operation on the first enabling signal and the second pre-input-output signal to generate the second input-output signal.

7. A method of generating a test pattern of a memory chip, the method comprising:

a first logic circuit generating and outputting a pattern enabling signal according to a first pattern signal and a second pattern signal;

a second logic circuit generating a first pre-input-output signal and a second pre-input-output signal according to a memory bank signal and a section signal, and outputting the first pre-input-output signal and the second pre-input-output signal according to the pattern enabling signal;

a first exclusive-OR gate executing an exclusive-OR logic operation on a third input-output signal and the second pattern signal to generate and output a first enabling signal;

a third logic circuit generating and outputting a first input-output signal and a second input-output signal according to the first enabling signal, the first pre-input-output signal, and the second pre-input-output signal; and writing a predetermined logic voltage to each memory cell of the memory chip according to the first input-output signal and the second input-output signal.

8. The method of claim 7, wherein the first logic circuit generating and outputting the pattern enabling signal according to the first pattern signal and the second pattern signal comprises:

utilizing a first exclusive-NOR gate to execute an exclusive-NOR logic operation on the first pattern signal and the second pattern signal for generating and outputting the pattern enabling signal.

9. The method of claim 7, wherein the second logic circuit generating the first pre-input-output signal and the second pre-input-output signal according to the memory bank signal and the section signal comprises:

utilizing a second exclusive-OR gate to execute an exclusive-OR logic operation on the memory bank signal and the section signal for generating the first pre-input-output signal; and utilizing a second exclusive-NOR gate to execute an exclusive-NOR logic operation on the memory bank signal and the section signal for generating the second pre-input-output signal.

10. The method of claim 7, wherein the second logic circuit outputting the first pre-input-output signal and the second pre-input-output signal according to the pattern enabling signal comprises:

utilizing a first inverter, a second inverter, a first transmission gate, a second transmission gate, a first switch, and a second switch to output the first pre-input-output signal and the second pre-input-output signal according to the pattern enabling signal.

11. The method of claim 7, wherein the third logic circuit generating and outputting the first input-output signal and the second input-output signal according to the first enabling signal, the first pre-input-output signal, and the second pre-input-output signal comprises:

utilizing a third exclusive-OR gate to execute an exclusive-OR logic operation on the first enabling signal and the first pre-input-output signal for generating the first input-output signal; and utilizing a fourth exclusive-OR gate to execute an exclusive-OR logic operation on the first enabling signal and the second pre-input-output signal for generating the second input-output signal.

12. The method of claim 7, wherein writing the predetermined logic voltage to each memory cell of the memory chip according to the first input-output signal and the second input-output signal is utilizing a solid pattern to write the predetermined logic voltage to each memory cell of the memory chip.

13. The method of claim 7, wherein writing the predetermined logic voltage to each memory cell of the memory chip according to the first input-output signal and the second input-output signal is utilizing a checkerboard pattern to write the predetermined logic voltage to each memory cell of the memory chip.

14. The method of claim 7, wherein writing the predetermined logic voltage to each memory cell of the memory chip according to the first input-output signal and the second input-output signal is utilizing a row bar pattern to write the predetermined logic voltage to each memory cell of the memory chip.

15. The method of claim 7, wherein writing the predetermined logic voltage to each memory cell of the memory chip according to the first input-output signal and the second input-output signal is utilizing a column bar pattern to write the predetermined logic voltage to each memory cell of the memory chip.

* * * * *